United States Patent [19]

Kumar

[11] Patent Number: 4,959,656
[45] Date of Patent: Sep. 25, 1990

[54] EFFICIENT DETECTION AND SIGNAL PARAMETER ESTIMATION WITH APPLICATION TO HIGH DYNAMIC GPS RECEIVER

[75] Inventor: Rajendra Kumar, Cerritos, Calif.

[73] Assignee: The United States of America as represented by the Administrator of the National Aeronautics and Space Administration, Washington, D.C.

[21] Appl. No.: 429,734

[22] Filed: Oct. 31, 1989

[51] Int. Cl.$^5$ .................. G01S 5/02; H04B 7/185; H04L 27/22

[52] U.S. Cl. .................. 342/418; 342/352; 342/357; 329/306; 375/80; 375/94

[58] Field of Search .............. 342/418, 357, 358, 386, 342/352; 329/306–309; 375/80, 84, 94–96

[56] References Cited

U.S. PATENT DOCUMENTS

| | | | |
|---|---|---|---|
| 3,394,313 | 7/1968 | Ellis et al. | 342/418 |
| 4,067,060 | 1/1978 | Poussart et al. | 364/151.3 |
| 4,112,497 | 9/1978 | Layland et al. | 364/728 |
| 4,139,897 | 2/1979 | Gardner et al. | 364/827 |
| 4,253,067 | 2/1981 | Caples et al. | 329/306 |
| 4,438,524 | 3/1984 | Mvilwijk | 375/80 |
| 4,468,793 | 8/1984 | Johnson et al. | 375/97 |
| 4,578,678 | 3/1986 | Hurd | 343/357 |
| 4,586,153 | 4/1986 | Hobrough | 364/724 |
| 4,641,143 | 2/1987 | Apostolos | 342/445 |
| 4,647,935 | 3/1987 | Helbing | 342/357 X |
| 4,649,392 | 3/1987 | Apostolos | 342/192 |
| 4,651,154 | 3/1987 | Wong et al. | 342/358 X |
| 4,701,934 | 10/1987 | Jasper | 342/357 X |
| 4,797,923 | 1/1989 | Clarke | 381/31 |
| 4,807,256 | 2/1989 | Holmes et al. | 375/97 |
| 4,821,284 | 4/1989 | Thomas, Jr. | 375/96 |
| 4,896,336 | 1/1990 | Henely et al. | 375/80 |

OTHER PUBLICATIONS

R. Kumar, "Efficient Detection and Signal Parameter Estimation with Applications to High Dynamic GPS Receivers", Jet Propulsion Lab., California Institute of Technology.

Primary Examiner—Gilberto Barrón, Jr.
Attorney, Agent, or Firm—Thomas H. Jones; John R. Manning

[57] ABSTRACT

In a system for deriving position, velocity, and acceleration information from a received signal emitted from an object to be tracked wherein the signal comprises a carrier signal phase modulated by unknown binary data and experiencing very high Doppler and Doppler rate, this invention provides combined estimation/detection apparatus for simultaneously detecting data bits and obtaining estimates of signal parameters such as carrier phase and frequency related to receiver dynamics in a sequential manner. There is first stage for obtaining estimates of the signal parameters related to phase and frequency in the vicinity of possible data transitions on the basis of measurements obtained within a current data bit. A second stage uses the estimates from the first stage to decide whether or not a data transition has actually occurred. There is a third stage for removing data modulation from the received signal when a data transition has occurred and a fourth stage for using the received signal with data modulation removed therefrom to update global parameters which are dependent only upon receiver dynamics and independent of data modulation. Finally, there is a fifth stage for using the global parameters to determine the position, velocity, and acceleration of the object.

16 Claims, 3 Drawing Sheets

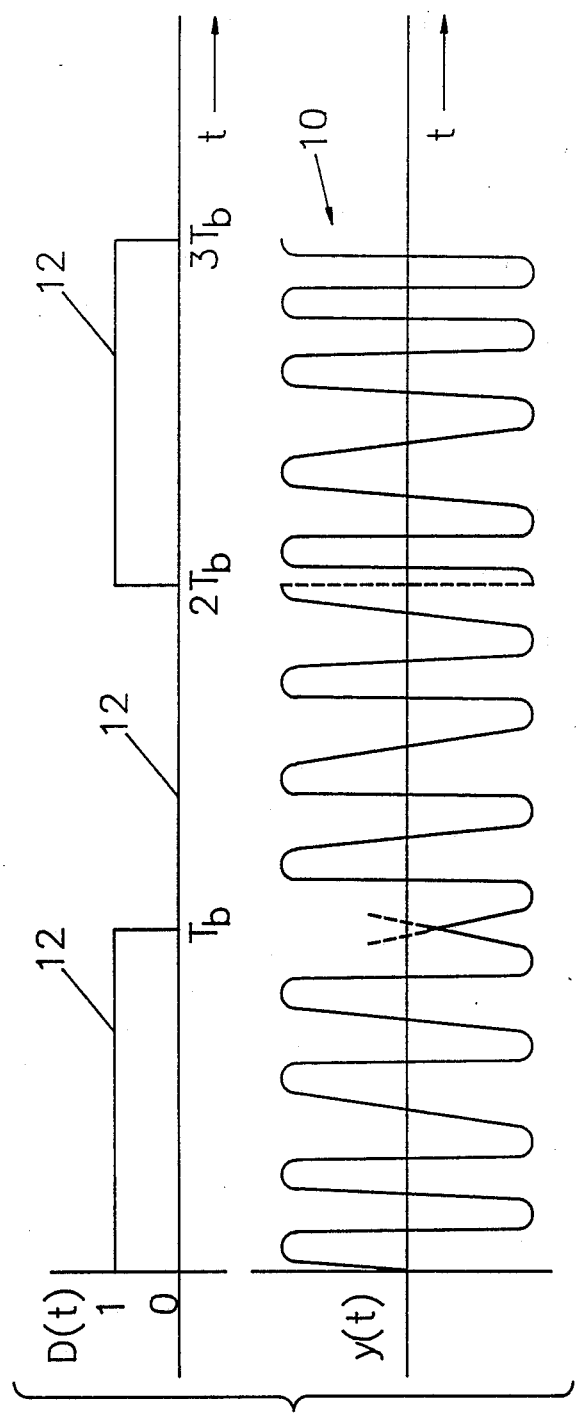
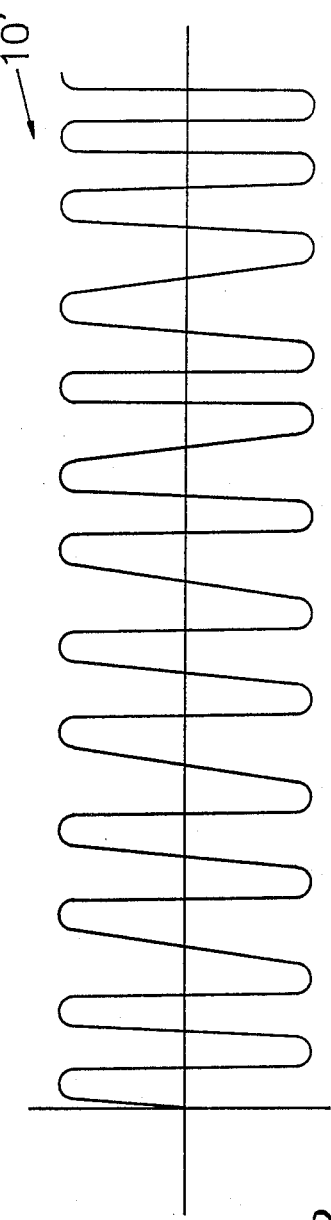
FIG. 1
FIG. 2

EFFICIENT DETECTION AND SIGNAL PARAMETER ESTIMATION WITH APPLICATION TO HIGH DYNAMIC GPS RECEIVER

ORIGIN ON THE INVENTION

The invention described herein was made in the performance of work under a NASA contract, and is subject to the provisions of Public Law 96-517 (35 USC 202) in which the Contractor has elected not to retain title.

TECHNICAL FIELD

The invention relates to tracking systems employing analysis of a known frequency being emitted by the tracked object and, more particularly, in a system for deriving position, velocity, and acceleration information from a single emitted from an object to be tracked wherein the signal comprises a carrier signal phase modulated by unknown binary data and experiencing very high Doppler and Doppler rate, to the method of providing the parameters associated with the signal from which the position, velocity, and acceleration information can be derived comprising the steps of, sampling the signal during multiple sample times within a first binary bit period; using data from samples obtained during the first binary bit period to determine the phase of the signal just prior to the end of the first binary bit period; sampling the signal during multiple sample times within a next binary bit period; using data from samples obtained during the next binary bit period to determine the phase of the signal just after the end of the first binary bit period; comparing the phase of the signal just after the end of the first binary bit period to the phase of the signal just prior to the end of the first binary bit period; adjusting the signal data associated with the second binary period to reflect a change in bit status if the phase of the signal just after the end of the first binary bit period is offset from the phase of the signal just prior to the end of the first binary bit period by more than a preestablished threshold amount; repeating the foregoing steps to create modified signal data reflecting the signal in an unmodulated state; and, using the modified signal data to estimate the parameters from which the position, velocity, and acceleration information are derived.

In the preferred embodiment, the steps of using data from samples obtained during the first binary bit period to determine the phase of the signal just prior to the end of the first binary bit period and using data from samples obtained during the next binary bit period to determine the phase of the signal just after the end of the first binary bit period each comprises the steps of, using the data from the samples in a first instance to estimate the phase of the signal; using an estimate from the first instance to update an estimation algorithm being employed to estimate the phase; and, reusing the data from the samples in a second instance to re-estimate the phase of the signal whereby errors tend to cancel out and an improved estimate of the phase is provided. Preferably, an adaptive Hilbert transform in a phase locked loop is employed to estimate the parameters.

BACKGROUND ART

In the field of tracking systems employed for tracking satellites, missiles, and the like, it is the object of the apparatus and methods employed therein to provide accurate tracking information about the tracked object. While radar is useful for slower moving objects in providing ranging information, tracking systems employed with, for example, Global Positioning Systems (GPS), space probes under dynamics, the Space Shuttle, space stations, satellite communications, and the like, must provide more information and more accurate information, all under extremely adverse conditions. For example, a rocket (both outgoing and incoming) is typically under high dynamic forces imparting rapid acceleration and increases in velocity.

In a great many cases in the area of interest, the tracked object is emitting a detectable radio frequency (RF) signal. Most often, the RF signal is the carrier for digital information being relayed to a ground station. As is well known, any alternating signal will be effected by the Doppler effect of its movement. Thus, a siren on a vehicle operating at a fixed audio frequency will appear to be at a higher frequency when approaching a point at a fixed velocity and will appear to be at a lower frequency when moving away from the same point at the same fixed velocity. If the vehicle is under acceleration, the frequency (and therefore the tone) of the siren will appear to be increasing and vice versa when in a state of deceleration. With respect to object tracking, the Doppler effect on an emitted detectable frequency can be put to good use in deriving speed and acceleration data about the object employing known mathematical techniques and a computer's rapid computational power.

Where the speeds and dynamics involved are not in the excess, well known prior art techniques have been employed to perform the data analysis on the received signal as sampled to provide the data which is analyzed. Thus, phase-locked loops or extended Kalman filters are commonly employed in the prior art for carrier phase estimation. Likewise, a Fast Fourier Transform (FFT) is a commonly employed mathematical technique. Where the parameters involved are in the excess as in the case of a very high dynamic GPS receiver, these prior art techniques simply do not operate. For example, FFT requires a 30dB-Hz (1000:1) signal power-to-noise spectral density ratio (SNR) or better to provide accurate results. Under the high dynamics and the sample sizes in the environment of interest, such a SNR is not possible so FFT analysis is not possible.

The problem can possibly best be understood by reference to the simplified waveform and timing diagram of FIG. 1. As will be recalled, the typical signal 10 comprises an alternating waveform carrier with binary data impressed thereon. If the binary data were not present, the analysis of the signal 10 would not be a problem as the sample period could be sufficiently long to provide a high enough SNR for standard analysis techniques and circuitry to be effective. Such is not the case, however. For example, the signal 10 of FIG. 1 depicts a portion representing the binary sequence 101. Because of the spacing of the binary data on the signal 10, the signal 10 must be sampled during sampling periods ($T_b$) 12 of limited length. During each period ($T_b$) typically ten to twenty samples are taken. This cannot provide a sufficiently high SNR for FFT, for example. As can be seen from FIG. 1, as the signal 10 changes from representing the first "1" to the "0", the phase of the signal 10 shifts 180°. This phase shift occurs close adjacent the end of the first sample period ($T_b$) 12 designated as "$T_b$". A similar phase shift occurs close adjacent the end of the second sample period ($T_b$) 12 designated as "$2T_b$" where the signal 10 changes from representing the "0" to the second "1". It is this change in phase as the signal 10 changes between "1" and "0" states which prevents the signal 10 from being analyzed for more than one sample period 12. Thus, since the sample periods 12 are not long enough to produce the required SNR for conventional analysis methods and apparatus, they cannot be used in this environment to produce reliable and accurate results.

The problem of estimating the parameters of a received quasi sinusoidal signal in the presence of noise has received considerable attention in the literature; however, for the case when the received carrier is modulated by unknown data and simultaneously experiences considerably high Doppler and Doppler rate, the research reported in the published literature is somewhat limited. One proposed prior art approach which has been analyzed for the GPS application is an estimator structure based on the maximum likelihood estimation (MLE) of code delay and Doppler frequency over a single data bit period. The "pseudo" estimates over different bit intervals are combined by a Kalman filter to provide tracking of Doppler frequency. By limiting the primary (ML) estimation period to less than one data bit period, the problem of detecting the data bits is bypassed; however, perhaps due to such a limitation and also due to high frequency rate involved (not explicitly estimated by the MLE), a threshold of about 30 dB-Hz in terms of the received carrier power-to-noise power spectral density ratio ($P/N_o$) was obtained. Due to the lack of knowledge of the data bits, phase estimation is not feasible by this scheme.

In terms of GPS applications, the problem of data modulation can be overcome by establishing a parallel (non-dynamic) link between the GPS satellites and a control ground receiver which also simultaneously receives the frequency translated version of the GPS signals. The data demodulation and estimation is then performed at the ground receiver. Once the data modulation is removed from the GPS receiver signal, the problem reduces to simply estimating the phase, frequency, etc., of an unmodulated RF carrier. This latter problem, of course, has been studied extensively in the literature.

In the literature describing the prior art, there are several techniques of data detection. If the signal waveform is known precisely and does not change from bit to bit, the data can be detected coherently by using matched filters or correlation receivers, irrespective of the actual waveform. If the waveform (carrier) has a constant known frequency, either a coherent or a differentially coherent detection can be employed, depending upon whether or not the phase of the carrier is known. In a decision-directed version of these techniques, the carrier phase and/or frequency are estimated by a phase-locked loop technique and the data detector becomes part of the loop. It is clear that these techniques most likely will not be feasible under the low SNR and high dynamics of the required environment in that the frequency may not be even nearly constant over the detection period and under such low SNR conditions that it may not be possible to acquire the lock with data modulation present.

In an alternate solution as in the Costas loop, the data detection problem is bypassed by a multiplicative technique; however, such a loop also suffers in terms of loss of SNR due to the multiplicative noise term which can be excessive for the high loop filter bandwidths required and the low received SNR.

It is thus apparent that schemes which incorporate data detection in a loop which in turn is made dependent upon the acquisition and tracking of the loop may not be desirable under such high dynamic conditions since the loop may not acquire to start with and may lose lock during tracking. Therefore, what is needed is a technique where data can be detected even under open loop condition.

STATEMENT OF THE INVENTION

Accordingly, it is an object of this invention to provide a method and apparatus for providing a sufficient sample period in a signal of interest containing binary data impressed on a carrier signal to allow analysis of the signal and estimation of the parameters thereof in the presence of high Doppler and Doppler rate.

It is another object of this invention to provide a method and apparatus for estimating the parameters of a received quasi sinusoidal signal in the presence of noise when the carrier is modulated by unknown data and the signal experiences high Doppler and Doppler rate.

It is still another object of this invention to provide a method and apparatus for estimating the parameters of a received quasi sinusoidal signal in the presence of noise when the carrier is modulated by unknown data and the signal experiences high Doppler and Doppler rate and for removing the modulation from the signal to provide unmodulated signal data which can be analyzed to provide estimates of the parameters of the signal.

Other objects and benefits of the invention will become apparent from the description which follows hereinafter when taken in conjunction with the drawing figures which accompany it.

BRIEF DESCRIPTION OF THE DRAWINGS

FIG. 1 is a simplified drawing depicting a typical received waveform of a phase modulated carrier contained binary data in juxtaposition with the sampling periods for three binary digits.

FIG. 2 is a simplified drawing of the waveform of FIG. 1 modified to reflect the waveform without the binary data impressed thereon.

DETAILED DESCRIPTION OF THE INVENTION

Figure 3:
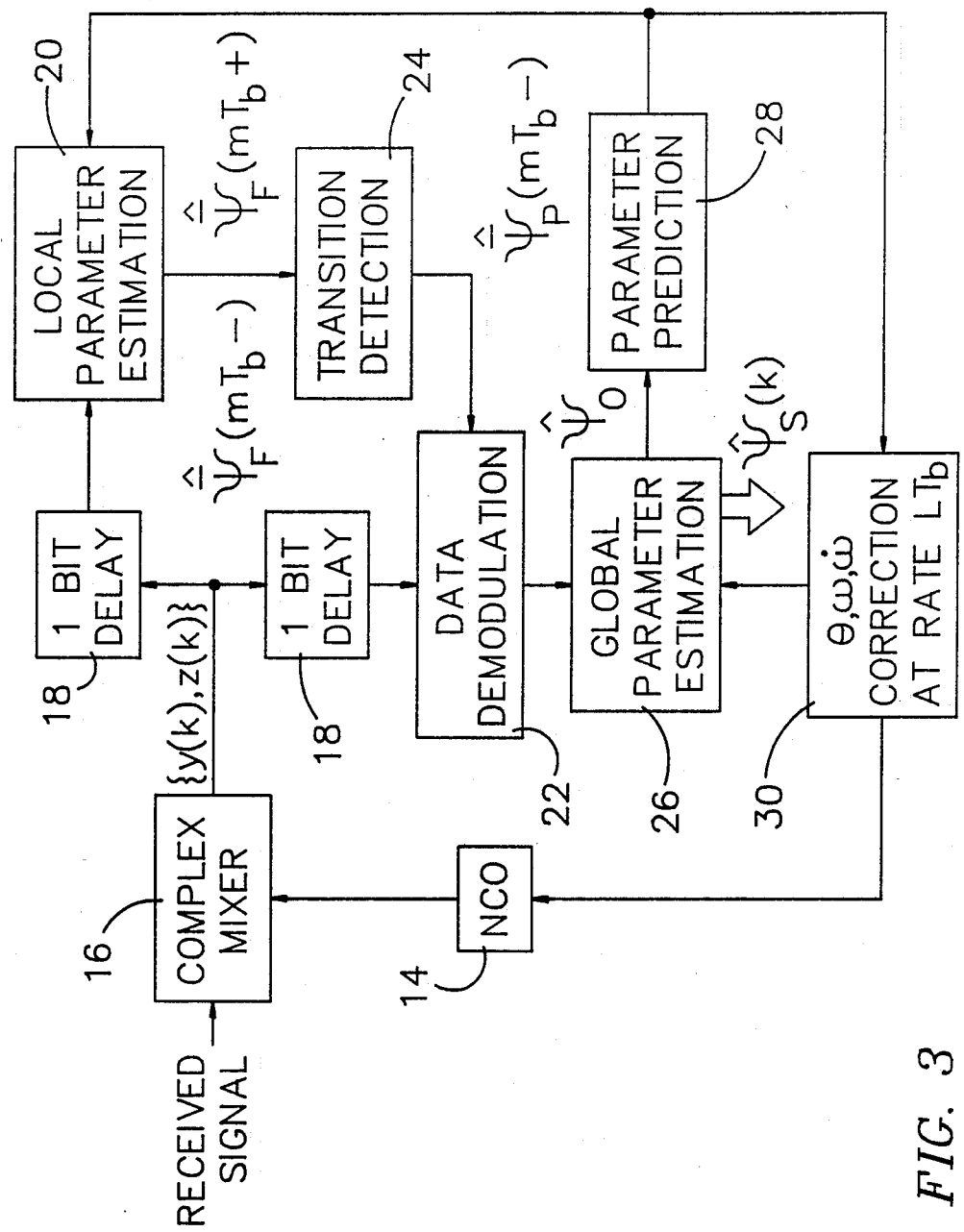
FIG. 3 is a simplified functional block diagram of apparatus and logic for accomplishing the method of the present invention in a preferred embodiment.

The inventor herein has written a detailed paper on the subject matter of this invention which sets forth with particularity the mathematical basis and proofs for the novel approach employed by the invention. In the interest of simplicity, however, this specification itself will be directed to the novel aspects of the invention and their implementation in a working environment shown in simplified form so as to enable one skilled in the art wishing to do so to implement the invention easily and quickly.

The invention is primarily a novel technique for simultaneously detecting data and estimating the parameters of a received carrier signal phase modulated by unknown data and experiencing very high Doppler, Doppler rate, etc. Note that the principal goal is the accurate estimation of the parameters of the carrier signal and that the detection of the data is an added benefit which flows from the approach employed. Typically, detection of the data is also desired; so, in this regard, the present invention can be employed to eliminate the need for other equipment dedicated to that particular task. As mentioned earlier, this particular environment occurs, for example, in the case of Global Positioning Systems (GPS), such as those under development by the Jet Propulsion Laboratory (JPL) in Pasadena, Calif., where the signal parameters are directly related to the position, velocity, and acceleration of the GPS receiver.

This invention addresses the original and more difficult problem of estimating the signal parameters from a data modulated sinusoidal carrier and offers a novel simultaneous estimation-detection scheme whose performances is very close to the estimation schemes proposed by the prior art for the case of an unmodulated carrier. In fact, from simulated studies performed by the inventor at JPL, for the case of high dynamics under consideration there is virtually no loss in terms of the required $P/N_0$ due to data modulation. Apart from the fact that in GPS applications this does away with the necessity of having a parallel direct satellite to ground receiver communication link, the method of this invention is very important in many other similar situations including (modulated) signal acquisition from NASA deep space probes undergoing high dynamics, where such parallel links may not be feasible.

The approach employed in the present invention is based upon first estimating the received signal local (data dependent) parameters over two consecutive bit periods (i.e. the periods 12 of FIG. 1), followed by the detection of a possible jump in these parameters. The presence of a detected jump signifies a data transition which is then removed from the received signal. This effectively demodulated signal is then processed to provide the estimates of global (data independent) parameters of the signal related to the position, velocity, etc. of the receiver.

One of the key aspects of this invention to be described hereinafter is the introduction of two different and equivalent schemes which can provide an improvement of up to 3 dB over the conventional implementation of Kalman filtering as applied to phase and frequency estimation under low to medium signal-to-noise ratio (SNR) conditions. One scheme is based upon reprocessing (cycling) the measurements over an optimally selected interval. Both of these schemes are based upon the recognition of two available error signals with nearly independent noise. In conventional implementations, one of these error signals is simply ignored. In the present invention, however, by reprocessing the observations over an optimally selected period, one can exploit the other error signal as well. It should be emphasized at this point that the improvement provided by the present invention is not due to better linearization as in iterated Kalman filtering (where the improvement increases with the iteration interval); but rather, due to the fact that if the reprocessing interval is optimal, the two sets of measurements are nearly independent, resulting in nearly 3 dB improvement of performance under low SNR. The alternative scheme, relevant to classical phase-locked loop structures, employs an adaptive Hilbert transform technique resulting in similar improvements. For those interested in such aspects, it should be pointed out that the overall complexity of the approach of the present invention is about three times the complexity of a single third order Kalman filter. The estimation algorithm for both the local and global parameters is, in fact, an improved version of a Kalman filter. For local parameter estimation, it is necessary to use an algorithm capable of estimating both the phase and frequency since the data is phase modulated on the carrier. For the global estimation algorithm, however, it is not necessary to estimate the phase and thus the Kalman filter may be substituted by frequency estimation resulting in a marginal reduction of the required $P/N_0$.

As set forth in Section 2 of the detailed paper an approximate minimization of equation (6) can be achieved by a recursive algorithm like a Kalman filter. It then goes on to describe that in the present invention what is employed is a computationally simpler suboptimal version of the optimal estimator of equation (6). What is accomplished is an estimation of a modified parameter vector directly and without knowledge of the particular data bit. The estimation of the vector, in turn, permits the computation of the total phase at the boundaries of that bit, i.e. just before the bit boundary and just after the bit boundary. It is obvious from FIG. 1, for example, that the total phase does not have any discontinuity at the actual bit boundary (i.e. at the boundary line between adjacent sample periods 12) and, thus, any difference between the above two estimates can be the result of only two things —data transition or noise. If the SNR is adequate, therefore, it is then possible to detect such a data transition with a "small" probability of error.

Simply stated, therefore, the approach of the present invention can be stated as follows. An suboptimal estimation of the signal phase is made on the basis of the samples within adjacent sample periods just before and just after the boundary of the sample periods. The phase differences are then compared to a threshold level which, if exceeded, indicates a change of data bit state between the adjacent sample periods. The signal is then adjusted to reflect a change in state and the corrected signal data employed in an extended Kalman filter, or the like, to derive the parameter information of interest. The extrapolated data stream, as mentioned earlier, can be used as desired in other aspects of the signal receiving process.

More specifically, the present invention employs a novel combined estimation/detection scheme which simultaneously detects data bits and obtains estimates of signal parameters such as carrier phase, frequency, etc., (related to receiver dynamics) in a sequential manner. The method employed is recursive in both the number of data bits and the observations within any one data bit. The procedure effectively involves two mutually coupled estimation processes. In one of these estimation processes, we obtain the estimates of the signal parameters (phase, frequency, etc.) in the vicinity of possible data transitions (i.e. at the symbol boundaries) on the basis of measurements obtained within the current data bit. These estimates (which are dependent upon both the data and the receiver dynamics and termed "local parameter estimates"), are then used to decide whether or not a data transition has actually occurred. On the basis of this information, data modulation is removed from the received signal and the modified observations are reprocessed to update the "global" parameters (dependent only upon the receiver dynamics and independent of data modulation) by taking into account the additional observations during the current "detected" bit. Thus, as depicted in FIG. 2, the knowledge of the data content of the signal 10 of FIG. 1 can be employed to create, in effect a modified signal 10' which can then be analyzed as an unmodulated signal.

A functional block diagram of a proposed implementation of the present invention is depicted in FIG. 3. It will be noted that, in this preferred implementation, a closed-loop configuration involving the feedback correction signal to the reference numerically controlled oscillator (NCO) 14 is required to keep the signal frequency $\dot{\theta}(t)$ at the phase detector output within the bandwidth of the filter (accumulator) following the phase detector. Such a correction at a rate equal to a submultiple of bit rate consists of simply transferring the estimate of frequency (and possibly that of frequency derivative as well) to the NCO 14. As can be seen from the diagram of FIG. 3, the received signal is mixed with the feedback signal from the NCO 14 in the mixer 16. A pair of 1 bit delays 18 clock the signal into the local parameter estimation logic 20 and data demodulation logic 22, respectively. The local parameter estimation logic 20 estimates the phase of the signal just before and just after the bit boundary as described in detail elsewhere herein. The two phase values are then compared by the transition detection logic 24 as also described in detail elsewhere herein. The output of the transition detection logic 24 is input to the data demodulation logic 22 as a control input. That is, the decision by the transition detection logic 24 determines what that data demodulation logic 22 does to the signal (i.e. whether to compensate for a change in bit state of the incoming signal steam or not). The output from the data demodulation logic 22 is then input to the global parameter estimation logic 26 which is then able to estimate the parameters of the signal on a global basis without the interference of the phase modulated data. Note that information from the global parameter estimation logic 26 is fed into the parameter prediction logic 28 which provides feedback information to both the local parameter estimation logic 20 and correction logic 30. The correction logic 30, in turn, provides the input to the NCO 14 and a feedback signal to the global parameter estimation logic 26. Thus, it can be seen that the entire process of the present invention as shown in FIG. 3 is a closed loop, self-optimizing process that employs estimation to make a best guess of the data so that the signal stream can be modified to remove the effects of the data thereon and the results of the estimation fed back to improve the further estimation that takes place as the signal input is analyzed on a continuing basis.

We will now describe in some detail the overall estimation/detection scheme without specific details of the estimation algorithm itself. The inventor has applied a modified Kalman filter; but, those skilled in the art will readily recognize and appreciate that other appropriate recursive parameter estimation algorithms may be adapted to the proposed framework. The estimation/detection scheme of this invention involves the following recursive (in number of data bits) steps. (For specific details, reference should be made to the detailed paper.)

Recursion in Data Bits

Step 1-Let N be the total number of samples (assumed to be an integer) in any one bit period (e.g. period 12 of FIG. 1) with the first sample appearing at time $t=0^+$ and the Nth sample occurring at time $T_b$-$T_s$, where $T_b$ denotes the bit period. With a recursive algorithm to be described shortly, we obtain the estimates of the parameter vector $\overline{\Phi}_0$ at time $t=0^+$ on the basis of the first N measurements.

Step 2-In order to detect bit transitions we need to obtain estimates of "local" parameters at the bit boundaries. Thus, to detect the possible transition at the end of the first data bit period, it is required to obtain estimates of the parameters $t=T_b-$ and $t=T_b+$. Noting that the parameters at $t=T_b-$ are related to the corresponding parameters at $t=0^+$ by the linear transformation (9) of the paper, one could predict the estimate of the parameter vector via the same linear transformation. Since we are interested in an optimum modulo $2\pi$ estimator of the phase, however, this will not produce the desired results as explained in the paper. Instead, the desired optimum modulo $2\pi$ estimator of the phase is obtained by reprocessing the first N measurements; but, with their time and phase reference measured with respect to $t=T_b-$ as also described in detail in the paper. In this manner, as mentioned earlier herein, the knowledge gained by the first processing is employed to assure that the subsequent reprocessing of the same data achieves an optimum result. Thus, as also mentioned previously, the second error signal, which is ignored in prior art techniques, is employed to optimize the results in the method of the present invention in this implementation.

Step 3-Assuming that all the parameters except $\overline{\theta}$ cannot change instantaneously, the predicted estimates of parameters at $t=T_b+$ (i.e. just after the possible data transition) are then determined by the same processing and reprocessing approach as described in detail in the paper.

Step 4-Having noted that irrespective of the dynamics involved (excluding the physically impossible case of instantaneous position change), $\overline{\theta}(T_b+)$ can differ from $\overline{\theta}(T_b-)$ only if a data transition occurs at $t=T_b$, i.e. $d_2 \neq d_1$. In the case of no transition, we have $d_2 = d_1$ and $\overline{\theta}(T_b+) = \overline{\theta}(T_b-)$. Thus, transition detection at the transition detection logic 24 and FIG. 3 is according to the simple rule:

$\hat{d}_2 = \hat{d}_1$ if $|\overline{\theta}(T_b+) \overline{\theta}(T_b-)| < \pi/2$ and $\hat{d}_2 \neq \hat{d}_1$ otherwise.

A detection error thus occurs only if the phase estimation error is greater than $\pi/2$.

Step 5-In this step, the estimate of the global parameter vector (i.e. parameters at $t=0^+$) is updated on the basis of modified measurements as described in the paper. The significance of this step is that this yields (near optimum) estimation of the absolute phase as against the modulo $2\pi$ phase, and from this absolute phase estimate (carrier phase in the absence of any data modulation) at any time t can be determined by the simple linear transformation of (9) in the appended paper. Equivalently, using a dynamic model for phase, one could directly estimate total phase $\theta(k)$ at any time instance k.

Step 6-Steps 2-4 are repeated for detection of subsequent data transitions and step 5 updates the estimate of $\psi_0$ on the basis of additional measurements during consecutive bit intervals.

Improved Filter:

We will now describe a novel (and simple) modification to the Kalman filter according to the present invention which results in about 3 dB improvement in terms of SNR. By the analysis contained in Section 4 of the paper, the inventor has shown that an independent observation is available which can be exploited to improve the estimate of x(k). Among several possible methods, the inventor selected as preferred an iterative method wherein the measurements {y(k), z(k)} are divided into groups of M measurements with M equal to N or an integer submultiple of N. Each of these groups is then processed by the estimation algorithm two or more times. Considering the first such group with k between 1 and M, under low SNR conditions the estimate of total phase $\theta(k)$ in the first iteration denoted by $\hat{\theta}^1(k)$ would be considerably different from its estimate $\hat{\theta}^2(k)$ in the second iteration, i.e. $|\hat{\theta}^2(k)-\theta(k)| << |\hat{\theta}^1(k)-\theta(k)|$. Thus, if the difference $\hat{\theta}^2(k)-\hat{\theta}^1(k)$ is approximately equal to $\pi/2$, the corresponding noise samples are nearly independent and a signal processing gain of about 3 dB is realized. For a given SNR, the value of M can be optimized to achieve maximum possible improvement. Note, however, that no such gain can be realized under high SNR as under such conditions $\hat{\theta}^1(k) \approx \theta(k) \approx \hat{\theta}^2(k)$. The foregoing observations have been verified by the inventor herein by computer simulation. It may be stated that the improvement as described is not due to iterative linerization of the nonlinearity as is usually the case; but rather, due to the very specific properties of the noise.

Modified Phase Locked Loop With Up to 3 dB Improvement

Figure 4:
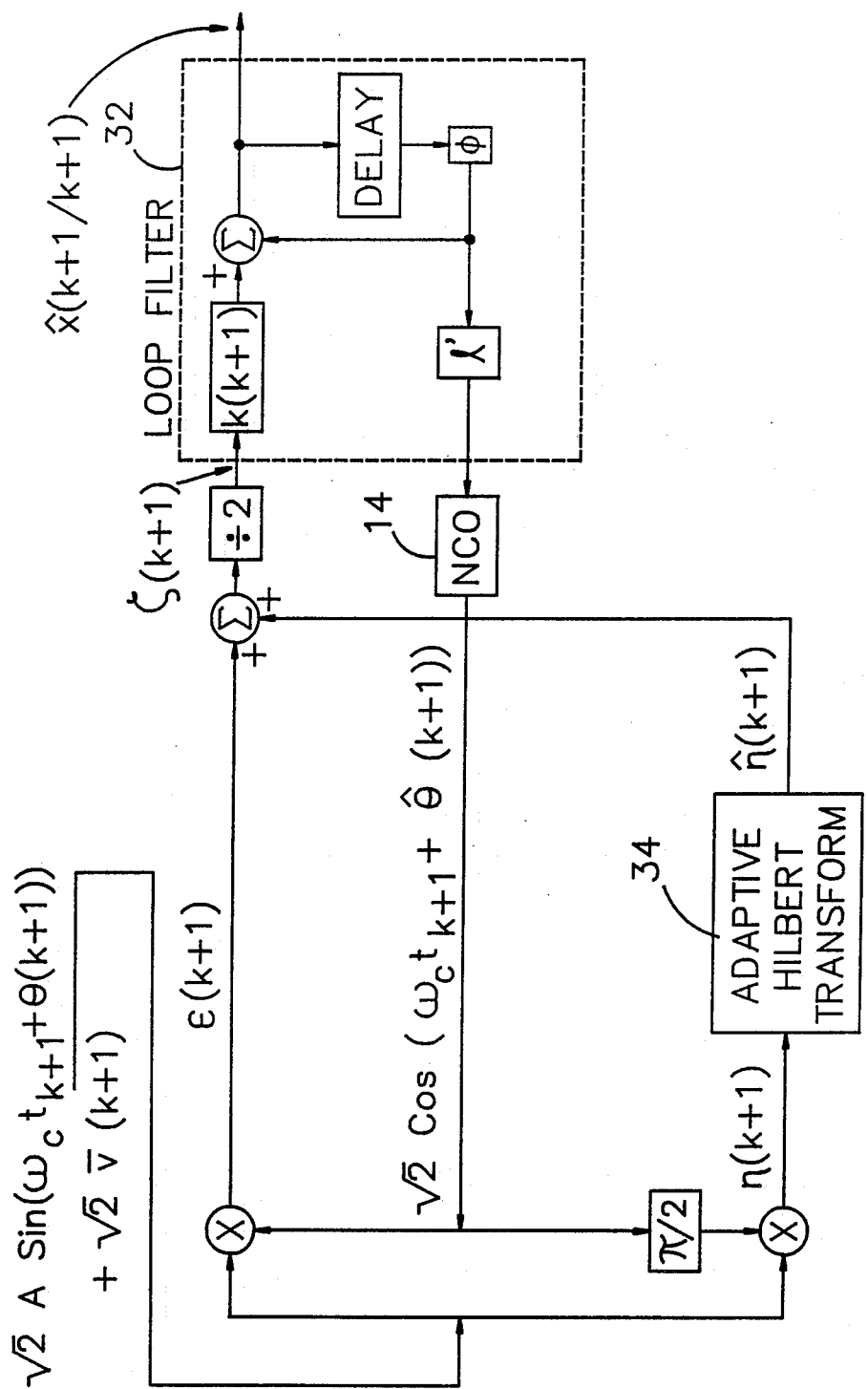
FIG. 4 is a simplified functional block diagram of a modified phase locked loop employing an adaptive Hilbert transform as employed in one embodiment of the present invention.

An implementation of the present invention in terms of a phase-locked loop (PLL) is shown in FIG. 4, where to keep consistency with the notion of previous materials herein, both the received bandpass signal s(k+1) and the NCO (numerically controlled oscillator) signal are represented in terms of the same frequency $\omega_e$. This too is described in greater detail in the paper. Note that the loop filter 32 may be designed either on the basis of a steady-state solution of the Riccati equation (Kalman gain) or via any other design procedure applicable to PLL filter design. For those interested in the basis therefor, the possible 3 dB improvement due to the Hilbert transform at 34 is described in detail in the paper.

Thus, it can be seen from the foregoing and the detailed paper appended hereto, that the present invention has truly met its stated objectives by providing a novel simultaneous estimation/detection scheme which detects data and estimates the parameters of a received carrier signal phase modulated by unknown data and experiencing very high Doppler, Doppler rate, etc., whereby the signal parameters directly related to the position, velocity, and acceleration of the receiver can be estimated with high precision.

Wherefore, having thus described my invention, what is claimed is:

1. In a system for deriving position, velocity, and acceleration information from a signal emitted from an object to be tracked wherein the signal comprises a carrier signal phase modulated by unknown binary data and experiencing very high Doppler and Doppler rate, the method of providing the parameters associated with the signal from which the position, velocity, and acceleration information can be derived comprising the steps of:

(a) sampling the signal during multiple sample times within a first binary bit period;

(b) using data from samples obtained during the first binary bit period to determine the phase of the signal just prior to the end of the first binary bit period;

(c) sampling the signal during multiple sample times within a next binary bit period;

(d) using data from samples obtained during the next binary bit period to determine the phase of the signal just after the end of the first binary bit period;

(e) comparing the phase of the signal just after the end of the first binary bit period to the phase of the signal just prior to the end of the first binary bit period;

(f) adjusting the signal data associated with the second binary period to reflect a change in bit status if the phase of the signal just after the end of the first binary bit period is offset from the phase of the signal just prior to the end of the first binary bit period by more than a pre-established threshold amount;

(g) repeating steps (a) through (f) to create modified signal data reflecting the signal in an unmodulated state; and, (h) using the modified signal data to estimate the parameters from which the position, velocity, and acceleration information are derived.

2. The method of claim 1 wherein said steps of using data from samples obtained during the first binary bit period to determine the phase of the signal just prior to the end of the first binary bit period and using data from samples obtained during the next binary bit period to determine the phase of the signal just after the end of the first binary bit period each comprises the steps of:

(a) using the data from the samples in a first instance to estimate the phase of the signal;

(b) using an estimate from the first instance to update an estimation algorithm being employed to estimate the phase; and (c) reusing the data from the samples in a second instance to re-estimate the phase of the signal whereby errors tend to cancel out and an improved estimate of the phase is provided.

3. The method of claim 1 wherein said step of using the modified signal data to estimate the parameters from which the position, velocity, and acceleration information are derived comprises the steps of:

employing an adaptive Hilbert transform in a phase locked loop to estimate the parameters.

4. In a system for deriving position, velocity, and acceleration information from a received signal emitted from an object to be tracked wherein the signal comprises a carrier signal phase modulated by unknown binary data and experiencing very high Doppler and Doppler rate, the method of providing the parameters associated with the signal from which the position, velocity, and acceleration information can be derived comprising the steps of:

(a) first estimating the received signal local (data dependent) parameters over two consecutive bit periods;

(b) detecting a possible jump in the parameters signifying a data transition;

(c) removing detected data transitions from the received signal to create an effectively demodulated signal; and, (d) processing the effectively demodulated signal to provide estimates of global (data independent) parameters of the signal related to position, velocity, and acceleration of the object.

5. The method of claim 4 wherein the steps thereof further comprise the steps of:
(a) sampling the signal during multiple sample times within a first binary bit period;
(b) using data from samples obtained during the first binary bit period to determine the phase of the signal just prior to the end of the first binary bit period;
(c) sampling the signal during multiple sample times within a next binary bit period;
(d) using data from samples obtained during the next binary bit period to determine the phase of the signal just after the end of the first binary bit period;
(e) comparing the phase of the signal just after the end of the first binary bit period to the phase of the signal just prior to the end of the first binary bit period;
(f) adjusting the signal data associated with the second binary period to reflect a change in bit status if the phase of the signal just after the end of the first binary bit period is offset from the phase of the signal just prior to the end of the first binary bit period by more than a pre-established threshold amount;
(g) repeating steps (a) through (f) to create modified signal data reflecting the signal in an unmodulated state; and,
(h) using the modified signal data to estimate the parameters from which the position, velocity, and acceleration information are derived.

6. The method of claim 5 wherein said steps of using data from samples obtained during the first binary bit period to determine the phase of the signal just prior to the end of the first binary bit period and using data from samples obtained during the next binary bit period to determine the phase of the signal just after the end of the first binary bit period each comprises the steps of:
(a) using the data from the samples in a first instance to estimate the phase of the signal;
(b) using an estimate from the first instance to update an estimation algorithm being employed to estimate the phase; and
(c) reusing the data from the samples in a second instance to re-estimate the phase of the signal whereby errors tend to cancel out and an improved estimate of the phase is provided.

7. The method of claim 5 wherein said step of using the modified signal data to estimate the parameters from which the position, velocity, and acceleration information are derived comprises the steps of:
employing an adaptive Hilbert transform in a phase locked loop to estimate the parameters.

8. In a system for deriving position, velocity, and acceleration information from a received signal emitted from an object to be tracked wherein the signal comprises a carrier signal phase modulated by unknown binary data and experiencing very high Doppler and Doppler rate, a combined estimation/detection method for simultaneously detecting data bits and obtaining estimates of signal parameters such as carrier phase and frequency related to receiver dynamics in a sequential manner comprising the steps of:
(a) obtaining estimates of the signal parameters related to phase and frequency in the vicinity of possible data transitions on the basis of measurements obtained within a current data bit;
(b) using the estimates from step (a) to decide whether or not a data transition has actually occurred;
(c) where a data transition has occurred, removing data modulation from the received signal;
(d) using the received signal with data modulation removed therefrom to update global parameters which are dependent only upon receiver dynamics and independent of data modulation; and,
(e) using the global parameters to determine the position, velocity, and acceleration of the object.

9. The method of claim 8 wherein the steps thereof further comprises the steps of:
(a) sampling the signal during multiple sample times within a first binary bit period;
(b) using data from samples obtained during the first binary bit period to determine the phase of the signal just prior to the end of the first binary bit period;
(c) sampling the signal during multiple sample times within a next binary bit period;
(d) using data from samples obtained during the next binary bit period to determine the phase of the signal just after the end of the first binary bit period;
(e) comparing the phase of the signal just after the end of the first binary bit period to the phase of the signal just prior to the end of the first binary bit period;
(f) adjusting the signal data associated with the second binary period to reflect a change in bit status if the phase of the signal just after the end of the first binary bit period is offset from the phase of the signal just prior to the end of the first binary bit period by more than a pre-established threshold amount;
(g) repeating steps (a) through (f) to create modified signal data reflecting the signal in an unmodulated state; and,
(h) using the modified signal data to estimate the parameters from which the position, velocity, and acceleration information are derived.

10. The method of claim 9 wherein said steps of using data from samples obtained during the first binary bit period to determine the phase of the signal just prior to the end of the first binary bit period and using data from samples obtained during the next binary bit period to determine the phase of the signal just after the end of the first binary bit period each comprises the steps of:
(a) using the data from the samples in a first instance to estimate the phase of the signal;
(b) using an estimate from the first instance to update an estimation algorithm being employed to estimate the phase; and,
(c) reusing the data from the samples in a second instance to re-estimate the phase of the signal whereby errors tend to cancel out and an improved estimate of the phase is provided.

11. The method of claim 9 wherein said step of using the modified signal data to estimate the parameters from which the position, velocity, and acceleration information are derived comprises the steps of:
employing an adaptive Hilbert transform in a phase locked loop to estimate the parameters.

12. In a system for deriving position, velocity, and acceleration information from a signal emitted from an object to be tracked wherein the signal comprises a carrier signal phase modulated by unknown binary data and experiencing very high Doppler and Doppler rate, the improvement for providing the parameters associated with the signal from which the position, velocity, and acceleration information can be derived comprising:

(a) first means for sampling the signal during multiple sample times within a first binary bit period;

(b) second means for using data from samples obtained during the first binary bit period to determine the phase of the signal just prior to the end of the first binary bit period;

(c) third means for sampling the signal during multiple sample times within a next binary bit period;

(d) fourth means for using data from samples obtained during the next binary bit period to determine the phase of the signal just after the end of the first binary bit period;

(e) fifth means for comparing the phase of the signal just after the end of the first binary bit period to the phase of the signal just prior to the end of the first binary bit period;

(f) sixth means for adjusting the signal data associated with the second binary period to reflect a change in bit status if the phase of the signal just after the end of the first binary bit period is offset from the phase of the signal just prior to the end of the first binary bit period by more than a preestablished threshold amount;

(g) seventh means responsive to said first, second, third, fourth, fifth, and sixth means for creating a modified signal data reflecting the signal in an unmodulated state; and, (h) eighth means for using the modified signal data to estimate the parameters from which the position, velocity, and acceleration information are derived.

13. The apparatus of claim 12 wherein said means for using data from samples obtained during the first binary bit period to determine the phase of the signal just prior to the end of the first binary bit period and said means for using data from samples obtained during the next binary bit period to determine the phase of the signal just after the end of the first binary bit period each comprises;

(a) means for using data from the samples in a first instance to estimate the phase of the signal;

(b) means for using an estimate from the first instance to update an estimation algorithm being employed to estimate the phase; and, (c) reusing the data from the samples in a second instance to re-estimate the phase of the signal whereby errors tend to cancel out and an improved estimate of the phase is provided.

14. The apparatus of claim 12 wherein said means for using the modified signal data to estimate the parameters from which the position, velocity, and acceleration information are derived comprises;

an adaptive Hilbert transform disposed in a phase locked loop.

15. In a system for deriving position, velocity, and acceleration information from a received signal emitted from an object to be tracked wherein the signal comprises a carrier signal phase modulated by unknown binary data and experiencing very high Doppler and Doppler rate, the improvement for providing the parameters associated with the signal from which the position, velocity, and acceleration information can be derived comprising:

(a) means for first estimating the received signal local (data dependent) parameters over two consecutive bit periods;

(b) means for detecting a possible jump in the parameters signifying a data transition;

(c) means for removing detected data transitions from the received signal to create an effectively demodulated signal; and, (d) means for processing the effectively demodulated signal to provide estimates of global (data independent) parameters of the signal related to position, velocity, and acceleration of the object.

16. In a system for deriving position, velocity, and acceleration information from a received signal emitted from an object to be tracked wherein the signal comprises a carrier signal phase modulated by unknown binary data and experiencing very high Doppler and Doppler rate, combined estimation/detection apparatus for simultaneously detecting data bits and obtaining estimates of signal parameters such as carrier phase and frequency related to receiver dynamics in a sequential manner comprising:

(a) first means for obtaining estimates of the signal parameters related to phase and frequency in the vicinity of possible data transitions on the basis of measurements obtained within a current data bit;

(b) second means for using the estimates from said first means to decide whether or not a data transition has actually occurred;

(c) third means for removing data modulation from the received signal when a data transition has occurred;

(d) fourth means for using the receiving signal with data modulation removed therefrom to update global parameters which are dependent only upon receiver dynamics and independent of data modulation; and, (e) fifth means for using the global parameters to determine the position, velocity, and acceleration of the object.

* * * * *